United States Patent [19]
Hwang

[11] Patent Number: 5,753,566
[45] Date of Patent: May 19, 1998

[54] METHOD OF SPIN-ON-GLASS ETCHBACK USING HOT BACKSIDE HELIUM

[75] Inventor: Yuan Ko Hwang, Hualien Hsien, Taiwan

[73] Assignee: Taiwan Semiconductor Manufactured Company, Ltd., Hsin-Chu, Taiwan

[21] Appl. No.: 652,769

[22] Filed: May 23, 1996

[51] Int. Cl.[6] .................................................. H01L 21/00
[52] U.S. Cl. .................................................. 438/715; 216/67
[58] Field of Search ........................... 156/643.1, 345 P, 156/345 PT, 345 PH, 345 WH, 345 PW; 216/67; 118/723 R, 723 E, 728; 204/298.15; 438/710, 715, 718, 719, 720, 721, 722, 723, 724

[56] References Cited

U.S. PATENT DOCUMENTS

| | | | |
|---|---|---|---|
| 4,478,678 | 10/1984 | Watanabe | 156/643 |
| 4,775,550 | 10/1988 | Chu et al. | 427/38 |
| 4,980,022 | 12/1990 | Fujimura et al. | 156/643 |
| 5,310,453 | 5/1994 | Fukasawa et al. | 156/643 |
| 5,462,603 | 10/1995 | Murakami | 118/719 |
| 5,486,235 | 1/1996 | Ye et al. | 134/1.1 |
| 5,529,657 | 6/1996 | Ishii | 156/345 |
| 5,584,971 | 12/1996 | Komino | 204/192.13 |

*Primary Examiner*—R. Bruce Breneman
*Assistant Examiner*—Luz Alejandro
*Attorney, Agent, or Firm*—George O. Saile; Stephen B. Ackerman; Graham S. Jones, II

[57] ABSTRACT

A workpiece with a back surface and a front surface has a layer formed on the front surface thereof which is to be etched by plasma etching. The workpiece is placed on a lower electrode in a plasma etching system with the back surface resting on the lower electrode. The workpiece is clamped to the lower electrode. A gas circulation system is formed in the surface of the lower electrode to supply heated gas, under pressure, to the back surface of a workpiece placed thereon to cause the workpiece to bow thereby forming a vaulted space below the workpiece. Then, while heating the back of the workpiece in this way, plasma etching of the layer upon the workpiece is performed.

18 Claims, 3 Drawing Sheets

5,753,566

METHOD OF SPIN-ON-GLASS ETCHBACK USING HOT BACKSIDE HELIUM

BACKGROUND OF THE INVENTION

1. Field of the Invention

This invention relates to apparatus and systems for forming a Spin-On-Glass (SOG) layer on a silicon substrate and more particularly to apparatus and a method for performing such a process in an etch back process.

2. Description of Related Art

In the past Spin-On-Glass has been etched back in a conventional plasma etching system. There is a need for improvement in the methods and the apparatus used to perform the method to secure improved products and to maximize the lifetime of the manufacturing tools.

SUMMARY OF THE INVENTION

In accordance with this invention, a method is provided for plasma etching a layer of a material formed upon a substrate comprising the following steps. Place a workpiece having a back surface and a front surface with the front surface having a layer formed thereon which is to be etched by plasma etching on a lower electrode in a plasma etching system. Clamp the workpiece upon the lower electrode, which has a gas circulation system formed in the surface thereof for supplying gases to the lower surface of the workpiece. Supply a heated gas through the gas circulation system under pressure to the back surface of the workpiece to bow the workpiece forming a vaulted space therebelow. Plasma etch the layer upon the workpiece.

Preferably, the gas employed comprises helium; the gas is heated to a temperature between about 70° C. and about 110° C. The gas is heated by a heater; the heater is controlled by a temperature controller; the pressure above the workpiece is between about 200 milliTorr and about 600 milliTorr and the pressure in the vaulted space below the workpiece is between about 8 Torr and about 14 Torr.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

Figure 1:
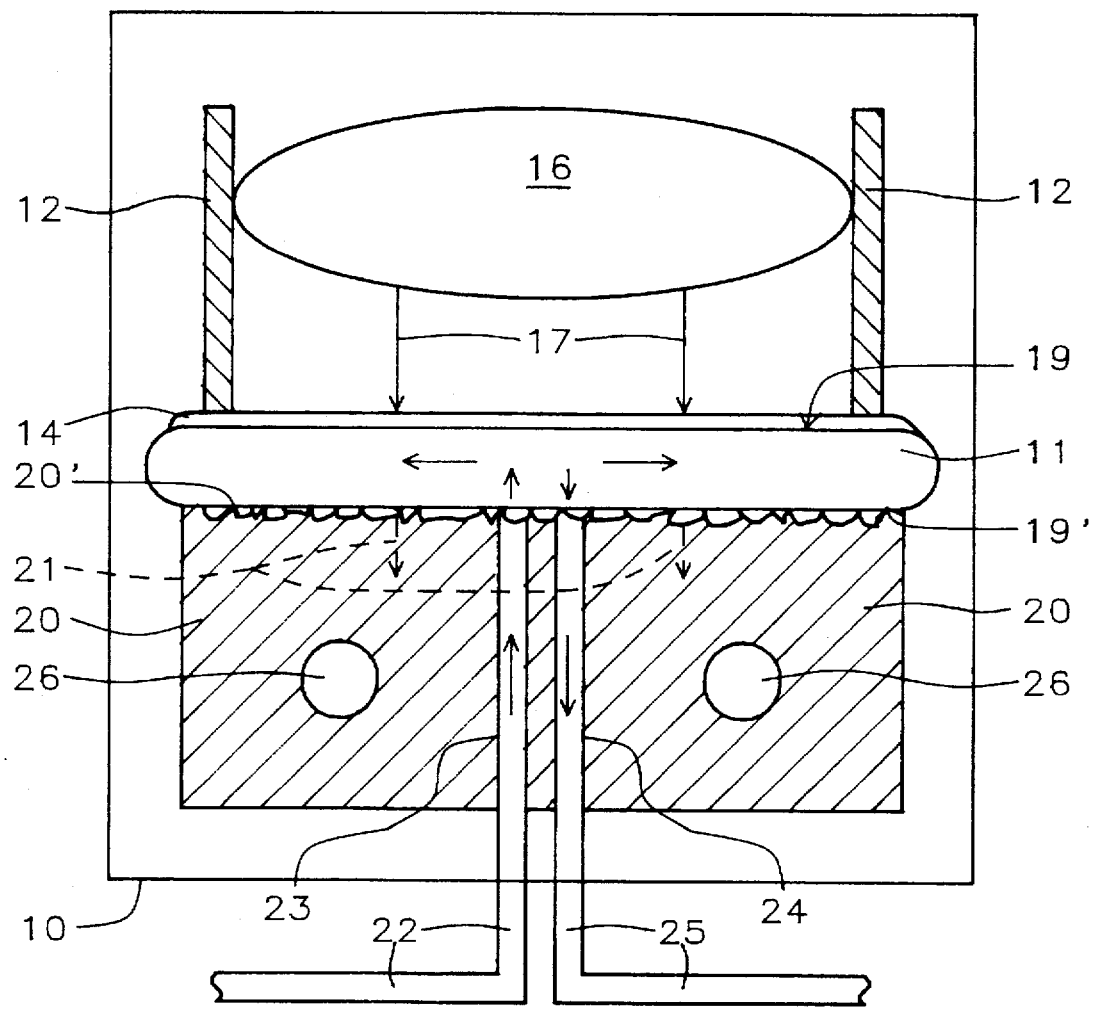
FIG. 1 shows an etch back process for a silicon wafer which has been previously coated with a SOG (Spin-On-Glass) layer on the upper surface of a wafer, using the etchback process is used to planarize the SOG layer on the wafer.

FIG. 1 shows a system for use in an EB (Etch Back) process for a silicon wafer 11 which has been previously coated with a SOG (Spin-On-Glass) layer 14 on the upper surface 19 of wafer 11. The EB process is used to planarize the SOG layer 14 on the wafer 11. The process is performed without using a backside helium cooling system of the kind provided in conventional plasma etching systems. The processing chamber 10 includes a cylindrical clamp 12 between which a plasma 16 is generated above the semiconductor wafer 11 with ions 17 being driven from the plasma 16 down onto the SOG layer 14 on the upper surface 19 of wafer 11.

The kinetic energy of the ions 17 and the heat of the chemical reaction occurring in the plasma heats the SOG layer 14 and the wafer 11. In most plasma etching processes, a cooling gas (such as helium which is inert) has been used to prevent the wafer 11 from overheating. However in the case of the SOG process of this invention, it has been found that it required that the wafer remain at a relatively high temperature to avoid polymer deposition created by carbon and hydrogen from a methylpolyfluoride $CHF_x$ (polytetrafluoroethylene-like (Teflon-like) deposits) during the process. Accordingly no cooling with helium is used during the plasma process shown in FIG. 1 because helium cooling gas at room temperature removes the heat from the wafer very fast, which was found to induce poor uniformity.

In FIG. 1, a system is shown in which the heat, obtained from EB (Etch Back) plasma process for etching the SOG layer 14, is transferred to the wafer, and then to the lower electrode directly by conduction without using the room temperature helium as a cooling medium. Finally, the heat is removed by cooling water passing through passageways 26 in lower electrode 20.

The wafer 11 has a lower surface 19' which rests on the top surface 20' of a lower metal electrode 20 which conducts heat away from lower surface 19' of the wafer 11 as indicated by the phantom lines 21 representing flow of heat flux through the electrode 20. The conventional lower electrode 20 in a chamber includes a forced flow gas cooling system which is not used in the embodiment of FIG. 1.

The unused cooling system of FIG. 1 includes an inlet pipe 22 connected to at least one inlet passageway hole 23, which would normally be used for passage of a cooling gas to cool the wafer 11 and one outlet passageway hole 24 through electrode 20 extending from the back of the wafer 11 through an outlet pipe 25 which would normally be used for exhaust of a cooling gas from cooling of the wafer 11. However, the forced flow gas cooling system is not used in the implementation of FIG. 1 for the reason that the passage of cooling gases cools the wafer 11 causing the unwanted $CHF_x$ (polytetrafluoroethylene-like (Teflon-like)) polymer deposits described above. We have discovered that it is necessary to keep the wafer 11 at a relatively high temperature of at least 60° C. to the 120° C. in order to prevent the deposition of the methylpolyfluoride $CHF_x$ polymers from the plasma onto the wafer surface.

However, in the embodiment of FIG. 1 the cooling technique contemplated is that the wafer 11 contacts the lower electrode 20 directly and heat from the wafer, created by the plasma process is transferred to the lower electrode by conduction. A problem has been discovered in that by using the implementation of FIG. 1 that polymer or particle deposition also occurs on the lower electrode 20 and the result is an imperfect upper surface 20' of the lower electrode 20. The imperfect surface 20' comprises the original surface as well as the surface which is the result of the polymer or particle deposition on that surface. The resulting imperfect upper surface 20' results in non-uniform heat exchange, which induces a poor SOG (Spin-On-Glass) EB (Etch Back) uniformity, which also reduces the life time of the lower electrode 20.

Most etching processes need a cooling gas on the backside surface of wafer to remove the heat created from a plasma process in order to protect the wafer from overheating. The most widely used cooling gas in the etching process is room temperature helium. However, the current SOG (Spin-On-Glass) process needs a relatively high temperature remaining on the wafer to avoid polymer deposition created by methylpolyfluoride $CHF_x$ during process, so there is no helium used during plasma process, because at room temperature helium removes the heat from the wafer very fast, which induces a poor uniformity.

The heat obtained from the SOG (Spin-On-Glass) EB (Etch Back) plasma process of FIG. 1 is transferred to the wafer 11, and then to the lower electrode 20 directly by conduction without the room temperature helium as a medium. Finally the heat is removed by cooling water.

Due to the imperfect surface 20' of the lower electrode 20 and a little polymer or particle deposition on the lower electrode after certain process cycles, the contact surface between the wafer 11 and the lower electrode 20 is not uniform and smooth, so the heat exchange is not uniform. It affects the SOG (Spin-On-Glass) EB (Etch Back) uniformity and results in deviation from specifications. At the same time, the life time of lower electrode 20 is also reduced.

In accordance with this invention, a hot helium gas is used as a medium to provides heat to a wafer and preserves the heat of the wafer during the plasma etching process. By injecting hot helium gas onto the backside of the wafer, the high wafer temperature requirement is achieved, so the polymer or the particle deposition on the wafer is avoided. Moreover, by using the hot helium as a heat exchange medium, the heat exchange between the wafer and the lower electrode is more uniform, so the SOG (Spin-On-Glass) uniformity is improved and its deviation from specifications is improved. The damage on the lower electrode is also improved, so the life time of the lower electrode is increased.

Figure 2:
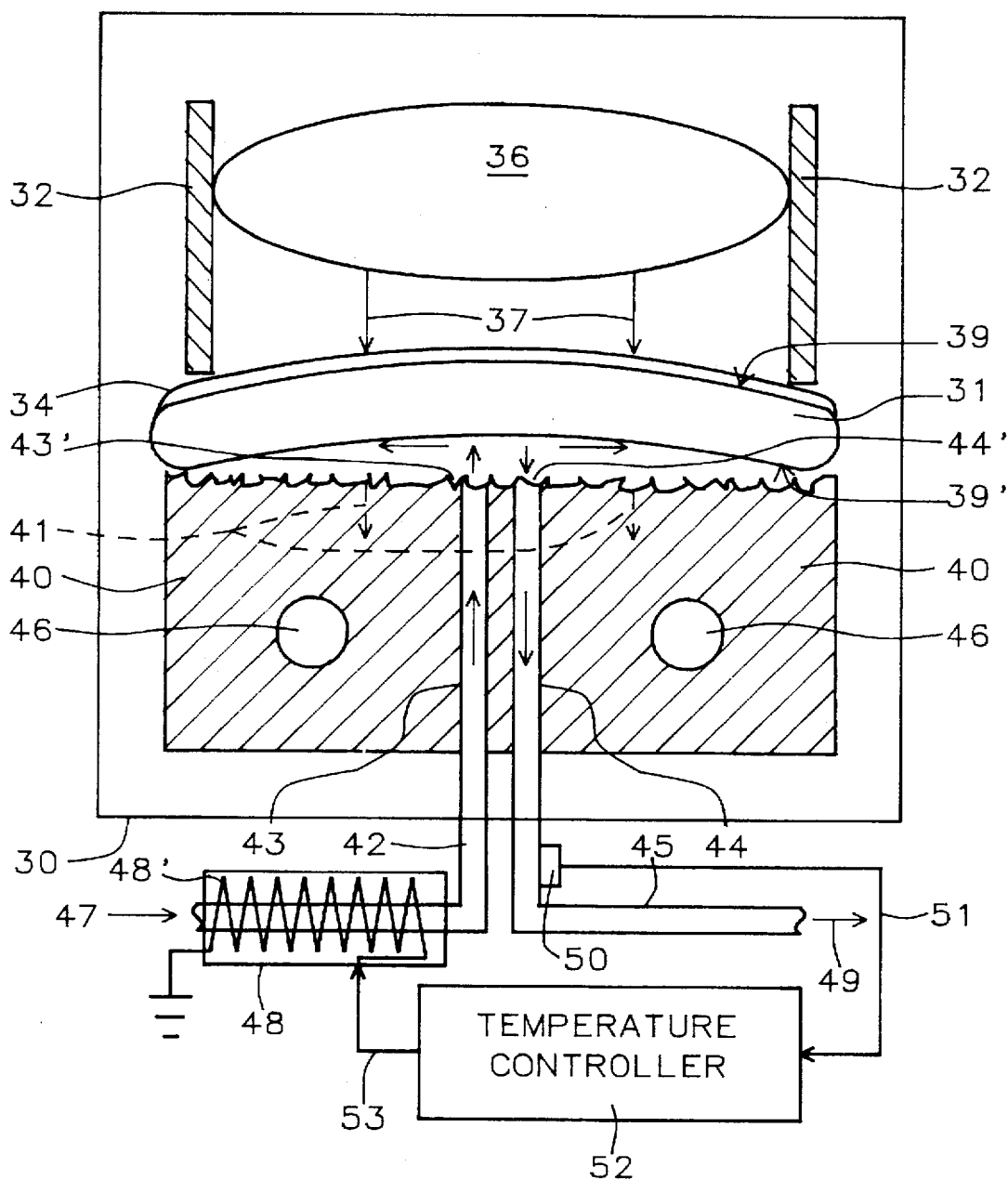
FIG. 2 shows an etch back process for planarizing a layer of Spin-On-Glass on a silicon wafer in accordance with this invention employing a backside helium cooling system for heating instead of cooling in an improved process in accordance with this invention.

FIG. 2 shows a EB (Etch Back) process for planarizing a layer of SOG (Spin-On-Glass) 34 on a silicon wafer 31 in accordance with this invention employing a backside helium cooling system for heating instead of cooling in an improved process in accordance with this invention. The processing chamber 30 includes clamp cylinder 32 (shown in section) between which a plasma 36 is generated above a semiconductor wafer 31 with ions 37 being driven from the plasma down onto the SOG layer 34 on the upper surface 39 of wafer 31. The clamp 32 is a ceramic cylinder. The clamp 32 is secured to an upper chamber element, such as element 80 of the system shown in FIG. 3.

Figure 3:
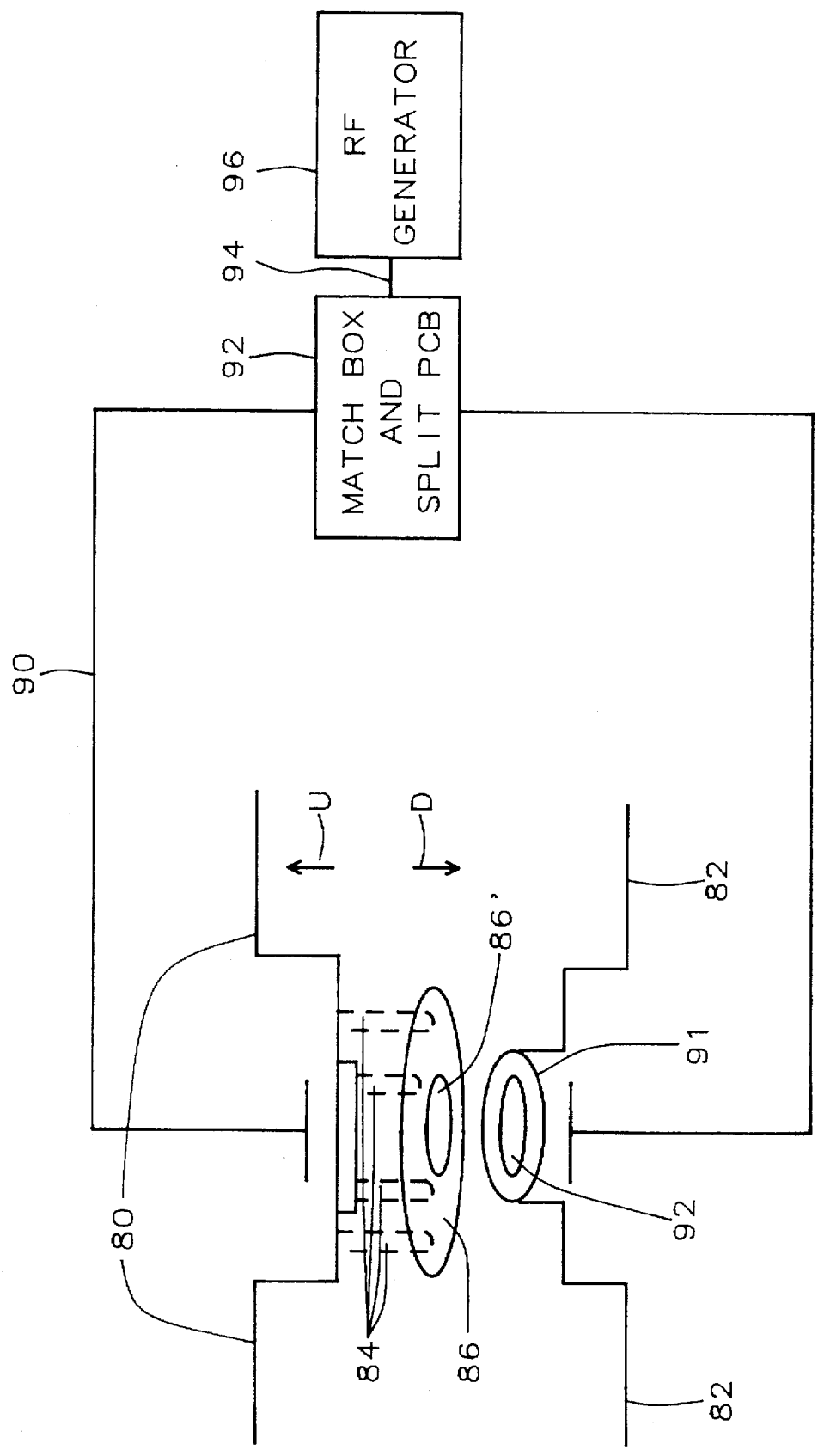
FIG. 3 shows a system for producing a plasma of the kind provided by the system of FIG. 2.

FIG. 3 shows a system for producing a plasma of the kind provided by the system of FIG. 2. A disc-shaped semiconductor wafer 92 is supported on support 91 which is carried on lower chamber element 82. An annular clamp 86 is shown with a circular opening 86' therethrough. Opening 86' is aligned with the wafer 92 therebelow. The clamp 86 is supported by a plurality of suspension elements 84 comprising plungers with springs suspended at the upper ends thereof from upper chamber element 80. A chamber 90 is provided. The upper chamber element 80 is raised up to release the clamp 86 and is lowered down to clamp the wafer 92. There is a match box (with an impedance matching network) and split PCB (printed circuit board) element 93 at the right end of chamber 90 which is powered by RF generator 96 which is connected to PCB element by line 94. The process uses RF power between about 300 watts and about 600 watts. The process uses pressure between about 200 mTorr and about 600 mTorr.

Applicant has discovered that despite the fact that the kinetic energy of the ions 37 and the heat of the chemical reaction occurring in the plasma heats the wafer 31, in contradiction to conventional practices in the state of the art, that it is unnecessary that such heat be dissipated by either cooling gases or direct thermal contact with the electrode 40 to avoid overheating of wafer 31 caused by the plasma. As can be seen, in the exaggerated drawing of FIG. 2, a vaulted or arched space 35 has been formed because the workpiece 31, 34 (wafer 31/SOG layer 34) has been temporarily bowed (i.e. or warped to form a cupped concave lower surface 39' and a convex or arched upper surface 39) by a pressure gradient caused by the greater pressure on the lower surface 39' of from about 8 Torr to about 14 Torr as compared to the low pressure on the upper surface 39 of from about 200 milliTorr to about 600 milliTorr (depending on process recipes) during the process of heating with the helium gas in arched space 35. The pressure above the workpiece 31, 34 is between about 200 milliTorr and about 600 milliTorr (depending on process recipes). The pressure in the vaulted space below the workpiece 31, 34 is between about 8 Torr and about 14 Torr (depending on process recipes).

The wafer is clamped into position on the periphery so that the pressure differential is maintained by the walls of clamp 32. The clamping employed is illustrated by FIG. 3.

Since the upper surface 39 is convex and the lower surface 39' is concave only the periphery of the lower surface 39' rests on the lower metal electrode 40 of the plasma etching chamber 30. Instead of conductive contact with wafer 31, thermally conductive metal electrode 40 conducts some heat away from the hot gases in a thermal convection type cooling process within the vaulted or arched space 35 between the lower surface 39' of the workpiece 31, 34. Heat conducted through the electrode 40 is indicated by the phantom lines 41 representing flow of heat flux through the electrode 40. The conventional lower electrode 40 in the chamber includes the forced flow gas cooling system which is used in the embodiment of FIG. 2 which in this case is employed as a forced flow gas heating system.

In accordance with the embodiment of FIG. 2, hot helium gas is used as a medium to provide heat to the back surface 39' of the workpiece 31, 34 and preserving the heat of workpiece 31, 34 during plasma process. By injecting the hot backside helium, the high temperature requirement on the wafer is achieved, so the polymer or the particle deposition on the wafer can be avoided. Moreover, by using the hot helium as a heat exchange medium, the heat exchange between the wafer and the lower electrode are more uniform and overall, so the SOG (Spin-On-Glass) uniformity and its deviation are improved. The damage on the lower electrode 40 is also improved, so the lifetime of the lower electrode 40 is increased.

The "cooling system" used for distributing heating gas in FIG. 2 includes an inlet pipe 42 connected to at least one inlet passageway hole 43 through electrode 40 to outlet 43', which would normally be used for passage of a cooling gas to cool the workpiece 31, 34 and one outlet passageway hole 44 extending via opening 44' through electrode 40 from the vaulted lower surface 39' of the workpiece 31, 34 to an outlet pipe 45 through which heating gas is exhausted after heating the vaulted space below the workpiece 31, 34.

As in FIG. 1, it is necessary to keep the workpiece 31, 34 at a relatively high temperature of at least from 60° C. to about 120° C. in order to prevent the deposition of methylpolyfluoride $CHF_x$ polymers from the plasma onto the wafer surface. The temperature of the SOG layer 34 and the top surface 39 the workpiece 31, 34 is to be between about 80° C. and about 120° C. The temperature of bottom surface 39' of the workpiece 31, 34 is to be between about 70° C. and about 110° C.

The helium gas 47 being admitted into line 42 is heated by a heater 48 containing a helical electrical heating wire 48' wrapped about line 42 to heat the incoming helium gas 47. Thermocouple unit 50 fastened to outlet pipe 45 measures the temperature of gas from the vaulted chamber 35. Thermocouple unit 50 is connected via line 51 to temperature controller 52 which is connected via line 53 to control supply of power to heater 48.

The temperature of the gases 47 at the inlet to passageway 42 from pipe 42 is between about 20° C. and about 25° C.

The result is more uniform heat exchange, good, uniformity after etchback (EB) of spin-on-glass (SOG) layers and reduced deviation from specifications, less deposition of polymers and particles and a longer lifetime for the lower electrode 39.

Finally the heat is removed by cooling water passing through passageways 46 in lower electrode 40.

SUMMARY

The hot backside helium works as a medium of uniform heat exchange between the workpiece 31, 34 and the vaulted space 35 above the lower electrode 40.

The hot backside helium instead of room temperature helium (which is not used to remove the heat of wafer) is used to provide heat to the workpiece 31, 34 and to preserve the heat of workpiece 31, 34 at a certain level that is critical for uniformity during the etchback (EB) process for an SOG layer 34. The hot backside helium provides a better control for the deviation of the EB (Etch Back) uniformity SOG (Spin-On-Glass) layer 34. The hot backside helium protects the lower electrode 40 from the damage of the etching process.

The improvements obtained by this invention are improvement of the SOG (Spin-On-Glass) uniformity and its deviation; reducing the polymer and particle deposition on wafer, and increasing the life time of lower electrode.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A method of plasma etching a layer of a material formed upon a substrate comprising the steps as follows:

placing a workpiece on a lower electrode in a plasma etching system, said workpiece having a back surface and a front surface, said back surface resting on said lower electrode, said front surface having a layer formed thereon which is to be etched by plasma etching, clamping said workpiece upon said lower electrode, said lower electrode having a gas circulation system formed in the surface thereof for supplying a heated gas to said back surface of said workpiece, supplying said heated gas through said gas circulation system under pressure to said back surface of said workpiece to bow said workpiece forming a vaulted space below said back surface, and plasma etching said layer upon said workpiece.

2. A method in accordance with claim 1 wherein:

said heated gas supplied under pressure to said back surface of said workpiece comprises helium gas.

3. A method in accordance with claim 1 wherein:

said gas supplied under pressure to said back surface of said workpiece is heated to a temperature between about 70° C. and about 110° C.

4. A method in accordance with claim 1 wherein:

said gas supplied under pressure to said back surface of said workpiece comprises helium, and said helium gas is heated to a temperature between about 70° C. and about 110° C.

5. A method in accordance with claim 1 wherein:

said gas supplied under pressure to said back surface of said workpiece is heated by a heater.

6. A method in accordance with claim 1 wherein:

said gas supplied under pressure to said back surface of said workpiece is heated by a heater, and said heater is controlled by a temperature controller.

7. A method in accordance with claim 1 wherein:

said heated gas supplied under pressure to said back surface of said workpiece comprises helium gas, and a heater controlled by a temperature controller heats said gas.

8. A method in accordance with claim 1 wherein:

said gas supplied under pressure to said back surface of said workpiece comprises helium, said helium gas is heated to a temperature between about 70° C. and about 110° C., and a heater controlled by a temperature controller heats said gas.

9. A method in accordance with claim 1 wherein:

said pressure above said workpiece is between about 200 milliTorr and about 600 milliTorr, and said pressure in said vaulted space below said workpiece is between about 8 Torr and about 14 Torr.

10. A method in accordance with claim 1 wherein:

said heated gas supplied under pressure to said back surface of said workpiece comprises helium gas, said pressure above said workpiece is between about 200 milliTorr and about 600 milliTorr, and said pressure in said vaulted space below said workpiece is between about 8 Torr and about 14 Torr.

11. A method in accordance with claim 1 wherein:

said gas supplied under pressure to said back surface of said workpiece is heated to a temperature between about 70° C. and about 110° C., said pressure above said workpiece is between about 200 milliTorr and about 600 milliTorr and said pressure in said vaulted space below said workpiece is between about 8 Torr and about 14 Torr.

12. A method in accordance with claim 1 wherein:

said gas supplied under pressure to said back surface of said workpiece comprises helium, and said helium gas is heated to a temperature between about 70° C. and about 110° C., said pressure above said workpiece is between about 200 milliTorr and about 600 milliTorr, and said pressure in said vaulted space below said workpiece is between about 8 Torr and about 14 Torr.

13. A method in accordance with claim 1 wherein:

said gas supplied under pressure to said back surface of said workpiece is heated by a heater, said pressure above said workpiece is between about 200 milliTorr and about 600 milliTorr, and said pressure in said vaulted space below said workpiece is between about 8 Torr and about 14 Torr.

14. A method in accordance with claim 1 wherein:

said gas supplied under pressure to said back surface of said workpiece is heated by a heater, and said heater is controlled by a temperature controller, said pressure above said workpiece is between about 200 milliTorr and about 600 milliTorr and said pressure in said vaulted space below said workpiece is between about 8 Torr and about 14 Torr.

15. A method in accordance with claim 1 wherein:

said heated gas supplied under pressure to said back surface of said workpiece comprises helium gas, and a heater controlled by a temperature controller heats said gas, said pressure above said workpiece is between about 200 milliTorr and about 600 milliTorr and said pressure in said vaulted space below said workpiece is between about 8 Torr and about 14 Torr.

16. A method in accordance with claim 1 wherein:

said gas supplied under pressure to said back surface of said workpiece comprises helium, said helium gas is heated to a temperature between about 70° C. and about 110° C., and a heater controlled by a temperature controller heats said gas, said pressure above said workpiece is between about 200 milliTorr and about 600 milliTorr and said pressure in said vaulted space below said workpiece is between about 8 Torr and about 14 Torr.

17. A method of plasma etching a layer of a material formed upon a substrate comprising the steps as follows:

placing a workpiece on a lower electrode in a plasma etching system, said workpiece having a back surface and a front surface, said back surface resting on said lower electrode, said front surface having a layer formed thereon which is to be etched by plasma etching, clamping said workpiece upon said lower electrode, said lower electrode having a gas circulation system formed in the surface thereof for supplying heated inert gas to said back surface of said workpiece, heating said inert gas with a heater controlled by a temperature controller, supplying said heated inert gas through said gas circulation system under pressure to heat said back surface of said workpiece thereby bowing said workpiece to form a vaulted space below said back surface, plasma etching said layer upon said workpiece, maintaining said pressure above said workpiece between about 200 milliTorr and about 600 milliTorr and said pressure in said vaulted space below said workpiece is between about 8 Torr and about 14 Torr.

18. A method of plasma etching a layer of a material formed upon a substrate comprising the steps as follows:

placing a workpiece on a lower electrode in a plasma etching system, said workpiece having a back surface and a front surface, said back surface resting on said lower electrode, said front surface having a layer formed thereon which is to be etched by plasma etching, clamping said workpiece upon said lower electrode, said lower electrode having a gas circulation system formed in the surface thereof for supplying heated helium gas to said back surface of said workpiece, heating said gas with a heater controlled by a temperature controller to a temperature between about 70° C. and about 110° C. with a heater controlled by a temperature controller, supplying said heated helium gas through said gas circulation system under pressure to heat said back surface of said workpiece thereby bowing said workpiece to form a vaulted space below said back surface, plasma etching said layer upon said workpiece, maintaining said pressure above said workpiece between about 200 milliTorr and about 600 milliTorr and maintaining said pressure in said vaulted space below said workpiece between about 8 Torr and about 14 Torr.

* * * * *